March 8, 1966 W. W. KOEFFLER 3,239,691
SOLID STATE RELAY EMPLOYING BACK-TO-BACK CONNECTED SCR ELEMENTS
Filed Sept. 3, 1963
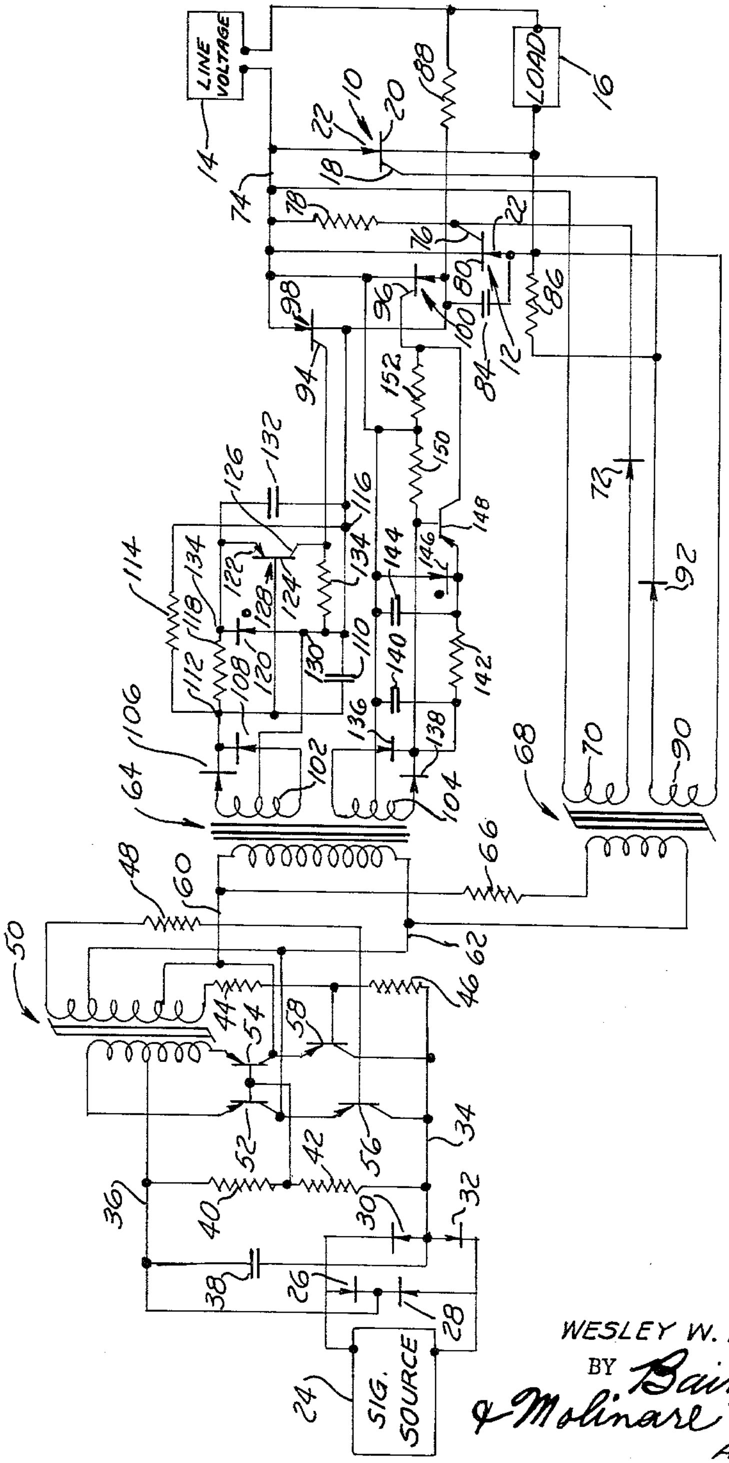
INVENTOR.
WESLEY W. KOEFFLER
BY Bair, Freeman & Molinare
ATTORNEYS

United States Patent Office 3,239,691
Patented Mar. 8, 1966

3,239,691
SOLID STATE RELAY EMPLOYING BACK-TO-BACK CONNECTED SCR ELEMENTS

Wesley W. Koeffler, Elwood, Ill., assignor to Phillips-Eckardt Electronic Corporation, Joliet, Ill., a corporation of Illinois Filed Sept. 3, 1963, Ser. No. 306,058
3 Claims. (Cl. 307—88.5)

This invention relates generally to electrical switching circuits and more particularly to a new and improved solid state relay switching circuit.

Due to the limitations of electromechanical relays, it is known in the art to perform switching functions by means of static switching circuits of the type which utilize solid state elements such as transistors and silicon controlled rectifiers. The use of a silicon controlled rectifier, also known as an SCR, for high speed switching of power loads has proved advantageous in eliminating the contact sticking, bounce and wear experienced on electromechanical relays or contactors. Typical prior art SCR static switching circuits are shown, for example, in a publication of the General Electric Company, entitled Silicon Controlled Rectifier Manual, Second Edition, 1961.

It is a general object of this invention to provide a new and improved solid state relay utilizing silicon controlled rectifiers.

It is a more specific object of this invention to provide a novel solid state relay having a pair of silicon controlled rectifiers connected "back-to-back" to enable the contact circuit to pass current in either direction.

It is another object of this invention to provide an improved solid state relay having a pair of silicon controlled rectifiers connected to enable the relay to conduct either A.C. or D.C. current from a line source to a load in response to a turn-on trigger signal.

It is a further object of this invention to provide an improved solid state relay having a pair of silicon controlled rectifiers for conducting either A.C. or D.C. current and further having unique control circuitry for turning off the D.C. current flow in the contact circuit in response to a turn-off trigger signal.

It is still a further object of this invention to provide an improved solid state relay, as above, which is characterized by its flexibility of operation and reliability of use.

The novel features which are characteristic of the invention are set forth with particularity in the appended claims. The invention itself, however, both as to its organization and method of operation, together with further objects and advantages thereof, will best be understood by reference to the following description taken in conjunction with the accompanying drawing in which:

The single figure of the drawing shows an electrical schematic diagram of one illustrative solid state relay circuit embodying the invention.

Referring now to the drawing, there is illustrated one embodiment of a solid state relay circuit incorporating the principles of the present invention. As set forth in greater detail hereinbelow, the solid state relay circuit makes advantageous use of silicon controlled rectifiers which, as known to those skilled in the art, are bistable in nature. Such silicon controlled rectifiers in their normal state, when not fired, present a very high resistance to the flow of electrical current. As such, the silicon controlled rectifiers in their normal state may be referred to as being in "open circuit." In the illustrative circuit embodiment of the drawing, it can be seen that the silicon controlled rectifiers 10 and 12 are connected in opposing polarity, or back-to-back, in parallel with each other and between the source of line voltage 14 and the load 16. When the silicon controlled rectifiers 10 and 12 are turned on or fired, in response to the application of a suitable signal, the line voltage from the source 14 is applied through the fired silicon controlled rectifiers to the load 16 to complete the relay switching action.

In accordance with the well-known operation of silicon controlled rectifiers, they may be turned on or fired into a conducting state by the application of an electrical pulse of sufficient amplitude applied between the gate and cathode elements, such as, the gate 18 and cathode 20 of the silicon controlled rectifier 10. Once fired, the silicon controlled rectifier will continue to conduct indefinitely until the current flow therethrough is reduced to a point below the holding current level of the device. This point of reduced current has a very narrow band width. As the current flow continues to be reduced from a nominal current level, the holding current point will be reached, and when at this critical point, the silicon controlled rectifier will suddenly cease conducting completely. At this time, the silicon controlled rectifier reverts back to the off mode or open circuit state.

The manner in which the silicon controlled rectifiers 10 and 12 are switched to control the application of the line voltage to the load in response to a signal pulse now will be described. The signal pulse from the signal source 24 can be initiated by any suitable means, such as by light, heat, voltage, current, pressure, speed, frequency, coincidence, or phasing, or in fact from any suitable condition detector or sensing device. The signal voltage from signal source 24 is fed into a single phase, full wave, bridge rectifier comprised of the rectifiers 26, 28, 30, and 32. This causes the signal voltage to be assigned a desired polarity and the signal is applied by means of the conductors 34 and 36 to a common base-common collector transistor switch comprised of the capacitor 38, the resistors 40, 42, 44, 46, and 48, the saturable core transformer 50, and the transistors 52, 54, 56 and 58. It will be noted that the transistors 52 and 54 have their bases connected in common to the junction of resistors 40 and 42 while the transistors 56 and 58 have their collectors connected in common to the conductor 34 between the resistors 42 and 46. The capacitor 38, which parallels the series connected resistors 40 and 42, provides a low impedance path for extraneous signal transients which might tend to otherwise upset the frequency stability of the transistor switch.

The emitters of transistors 52 and 54 are connected to the opposite ends of the primary winding of the saturable transformer 50, this primary winding being connected at a center tap to the conductor 36. The secondary winding of saturable transformer 50 is connected at one end to the resistor 44 and at the other end to the resistor 48, with center tap connections connected respectively to the collectors of transistors 52 and 54. In accordance with one aspect of this circuit, the saturable transformer 50 is provided with square loop magnetic cores to enable the use of saturable core switching. Those skilled in the art will appreciate that the output wave form from the saturable transformer 50 is square and has a frequency predicated on the volt/second parameters of the saturating transformer. The output of the saturable transformer 50 is connected by means of the conductors 60 and 62 to the primary winding of a nonsaturable transformer 64. In addition, the output of the saturable transformer 50 is connected by means of the conductors 60 and 62 and the resistor 66 to the primary winding of a second saturable transformer 68.

In accordance with a novel feature of the present invention, as is explained further below, the output of the saturable transformer 50 to the nonsaturating transformer 64 provides a low voltage A.C. signal for two respective "off trigger" circuits, while the output of the saturable transformer 50 to the second saturable transformer 68 provides an A.C. signal for two respective "on trigger" circuits.

Referring first to the "on trigger" circuits for the silicon controlled rectifiers, it can be seen that the secondary winding 70 of the saturable transformer 68 supplies the "on trigger" pulse for a silicon controlled rectifier 12, while the secondary winding 90 of the saturable transformer 68 supplies the "on trigger" pulse for the silicon controlled rectifier 10.

Transformer 68 operates in a saturated mode in response to an output pulse from the common-base, common-collector transistor switch. The resistor 66 in series with the primary winding of saturable transformer 68 serves as a current limiting device for the saturable transformer. The diode 72 in series with the secondary winding 70 of transformer 68, and the diode 92 in series with the secondary winding 90 of saturable transformer 68, cause the "on trigger" pulses to their respective silicon controlled rectifiers to be 180° out of phase with each other. Thus, in response to a signal pulse applied to the saturable transformer 68, a pulse of one polarity will be applied through the secondary winding 70 and diode 72 to the gate 76 of the silicon controlled rectifier 12, while a pulse of opposite polarity will be applied through the secondary winding 90 and diode 92 to the gate 18 of the silicon controlled rectifier 10. In this manner, the two silicon controlled rectifiers 10 and 12 will be respectively triggered to their "on" condition to complete a circuit between the source of line voltage 14 and the load 16.

Since the solid state relay of the present invention advantageously provides for the conduction of either A.C. or D.C. current from the line voltage source 14 to the load 16 upon the turning on of the silicon controlled rectifiers 10 and 12, two different means for turning off the silicon controlled rectifiers are provided. When A.C. current flows through the "back-to-back" silicon controlled rectifier arrangement, each respective silicon controlled rectifier conducts on the appropriate polarity of the current wave form.

The operation will be illustrated by dividing the A.C. current wave form into 180° increments and assuming, for this example, that the silicon controlled rectifier 10 has been triggered to its "on" condition and is passing current between the line voltage source 14 in the load 16. When the current flow is in phase with the voltage, the current will rise to its maximum at a 90° point and then will fall as the 180° point is reached. At the 180° point, the voltage and current wave forms assume an opposite polarity. However, before the 180° point is reached, the voltage wave form will drop to a point where the current will fall below the holding current level of the silicon controlled rectifier 10 and, in accordance with its well-known operation, the silicon controlled rectifier 10 will suddenly snap back into the "off" mode. In this manner, when A.C. current is conducted by the relay, each silicon controlled rectifier of the relay is automatically cut off when its current falls below the holding current level during its half cycle of conduction.

However, when D.C. current is passing through the silicon controlled rectifiers between the line voltage 14 and load 16, only one of the silicon controlled rectifiers will be passing current, depending upon the direction of the current flow through the relay and the polarization of the conducting device. Since the D.C. voltage remains constant in amplitude, in contrast to the A.C. voltage wave form, the conducting silicon controlled rectifier will continue to conduct since, unless other parameters of the circuit are changed, current will flow through the silicon controlled rectifier as long as it is above the holding current point of the device.

In accordance with the operation of the present invention, interruption of this D.C. current flow through the conducting silicon controlled rectifier is accomplished by supplying a momentary additional current to the load 16, which, until this point, has been receiving current from the conducting silicon controlled rectifier. When this additional momentary current flows through the load 16, a greater voltage drop occurs across the load 16, which serves to back bias the conducting silicon controlled rectifier momentarily, thereby reducing the current flow therethrough below its holding current point. At this time, the conducting silicon controlled rectifier will revert or snap back almost instantaneously to the "off" mode.

In accordance with a feature of this invention, the additional current supply used for supplying this momentary current to shut off the conducting silicon controlled rectifier consists of a storage capacitor 84 and a resistor 88 connected in series circuit with the load 16. As such, the storage capacitor 84 charges up to the load voltage through the resistor 88. When it is desired to interrupt the D.C. current flow in the conducting silicon controlled rectifier, an electrical pulse is applied to the gates 94 and 96 of the silicon controlled rectifiers 98 and 100, respectively, to trigger said silicon controlled rectifiers into conduction. This provides a low resistance discharge path for the instantaneous discharge of the storage capacitor 84 through the line voltage source 14 and the load 16. This momentary pulse of current through the load 16, due to the discharge of the storage capacitor 84, serves to back bias the silicon controlled rectifiers 10 and 12 to turn off the particular one of these silicon controlled rectifiers that is conducting at that time.

The manner in which the gates of the silicon controlled rectifiers 98 and 100 are triggered, to accomplish the above-described turn off action, now will be explained. It will be recalled that when the common base, common collector transistor switch provides an output to the saturable transformer 64, a low voltage A.C. signal will be supplied to the center tap secondary windings 102 and 104 of the transformer 64. Since the two "off trigger" circuits energized by this low voltage A.C. pulse are similar to each other, the operation will be described with respect to the "off trigger" circuit for the silicon controlled rectifier 98.

The secondary winding 102 of saturable transformer 64 is connected to a full wave rectifier comprising the diodes 106 and 108. The capacitor 110 is connected across the output of this full wave rectifier and therefore, it charges up to the peak D.C. voltage value of the full wave rectifier output.

Continuous D.C. current flow from the full wave rectifier divides into two parallel paths from the output terminal 112. Thus, current flows in the first path through the resistor 114 to the terminal 116, and flows in a second parallel path through the series circuit consisting of resistor 118, and Zener diode 120 to the terminal 116. Since current flow is through both parallel circuits, a forward voltage drop occurs across each of the resistors 114 and 118. Resistor 114 is connected across the output of the full wave rectifier and therefore, the voltage drop thereacross equals a total unregulated, rectified voltage. Resistor 118, however, is in series with a voltage regulating Zener diode 120 and therefore, the voltage drop across resistor 118 is equal to the difference between the unregulated output voltage of the full wave rectifier and the regulated voltage drop across the Zener diode 120.

It will be noted that the emitter 122 of transistor 128 is connected to the junction of resistor 118 and the Zener diode 120, and that the base 124 of transistor 128 is connected to the junction of resistor 114, resistor 118, capacitor 110, and the cathodes of the rectifiers 106 and 108.

The operation of the "off trigger" circuit can best be understood by assigning typical operating voltages to the circuit components and terminal points of the circuit. Thus, at normal operating conditions when the relay is in the conducting mode, terminal point 112 typically is 24 volts positive with respect to terminal point 130. As such, the current flow through the resistor 114 will be predicated upon the 24 volt differential thereacross.

The resistor 118 will have a voltage drop equal to the difference between this 24 volt source and the avalanche voltage of the Zener diode 120, which typically is 9 volts. This value therefore is 24 volts minus 9 volts or 15 volts, across the resistor 118. Also, the capacitor 110, which is connected between the terminal points 112 and 130 will have 24 volts thereacross and it will be charged up to this 24 volt value.

The transistor 128 supports 9 volts between its emitter 122 and collector 126 because its base 124 is connected to the terminal point 112 of the circuit, which is 15 volts positive with respect to the emitter 122 of transistor 128. As such, those skilled in the art will appreciate that the transistor 128 is cut off and does not conduct.

The capacitor 132, connected between the terminal point 134 and the terminal point 130, is a storage capacitor, and while the transistor 128 is cut off, will charge up to 9 volts. This condition will remain static until the voltage across the terminal points 112 and 130 decays slowly or otherwise drops to a point where the current flow through the resistor 118 becomes so slight that the subsequent voltage drop across the resistor 118 falls below the 9 volt level. When the terminal point 112 becomes lower than 9 volts with respect to terminal point 130, current will flow from the capacitor 110 through the emitter 122 and out through the base 124 of transistor 128 to terminal point 112, and subsequently through the resistor 114 back to the capacitor 132.

When base current flows in the transistor 128, as previously described, the transistor 128 goes into its conductive mode. This permits the bulk of the discharge current of the storage capacitor 132 to flow through the parallel circuit combination resistor 134, and to the gate to cathode junction of the silicon controlled rectifier 98, which then triggers this silicon controlled rectifier into conduction. At this point, in the manner described hereinabove, the capacitor 84 is permitted to discharge through the line voltage source 14 and the load 16 to back bias the conducting silicon controlled rectifier into its "off" mode.

The secondary winding 104 of saturable transformer 64 and its associated circuitry up to the silicon controlled rectifier 100 operate in the same manner as the "off trigger" circuit just described with respect to the silicon controlled rectifier 98, such that an "off trigger" pulse is provided to turn on or fire the silicon controlled rectifier 100 in response to the signal pulse from the signal source. In this "off-trigger" circuit, the components, diodes 136 and 138, capacitors 140 and 144, resistors 142, 150 and 152, Zener diode 146 and transistor 148 correspond respectively to diodes 106 and 108 capacitors 110 and 132, resistors 118, 114, and 134, Zener diode 120 and transistor 128 of the other "off-trigger" circuit. In this manner, an "off trigger" pulse is provided to turn off the silicon controlled rectifier 12 when D.C. current flows from the line voltage source 14 to the load 16.

While there has been shown and described a specific embodiment of the present invention, it will, of course, be understood that various modifications and alternative constructions may be made without departing from the true spirit and scope of the invention. Therefore, it is intended by the appended claims to cover all such modifications and alternative constructions as fall within their true spirit and scope.

What is claimed as the invention is:

1. The improvement of a solid state relay comprising the combination of first and second silicon controlled rectifiers connected in parallel between a source of line voltage and a load, said silicon controlled rectifiers being connected in opposite polarity for enabling either A.C. current or D.C. current to flow from the line voltage source to the load in response to the application of a turn-on trigger signal to the gates of said silicon controlled rectifiers, and control means for applying turn-on and turn-off trigger signals comprising a signal source, a pair of on-trigger circuits connected to said signal source by a saturable transformer, one of said on-trigger circuits including a rectifier connected to apply on-trigger signals of one polarity to the gate of said first silicon controlled rectifier for triggering it into conduction, the other on-trigger circuit including a rectifier connected to apply on-trigger signals of an opposite polarity to the gate of said second silicon controlled rectifier triggering it into conduction, and a pair of off-trigger circuits connected to said signal source by a non-saturating transformer, each of said off-trigger circuits having its output connected to a normally non-conducting switching device, and capacitor means in series with said normally non-conducting switching devices, said source of line voltage and said load, such that the application of a signal to said off-trigger circuits causes said switching devices to be switched to a conducting condition for enabling said capacitor means to be discharged through the load to back-bias the conducting silicon controlled rectifier to its non-conducting state.

2. The improvement of a solid state relay comprising the combination of first and second silicon controlled rectifiers connected in parallel between a source of line voltage and a load, said silicon controlled rectifiers being connected in opposite polarity for enabling either A.C. current or D.C. current to flow from the line voltage source to the load in response to the application of a turn-on trigger signal to the gates of said silicon controlled rectifiers, and control means for applying turn-on and turn-off trigger signals comprising a signal source, a pair of on-trigger circuits connected to said signal source, one of said on-trigger circuits including a rectifier connected to apply on-trigger signals of one polarity to the gate of said first silicon controlled rectifier for triggering it into conduction, the other on-trigger circuit including a rectifier connected to apply on-trigger signals of an opposite polarity to the gate of said second silicon controlled rectifier triggering it into conduction, and a pair of off-trigger circuits connected to said signal source, each of said off-trigger circuits having its output connected to a normally non-conducting switching device, and capacitor means in series with said normally non-conducting switching devices, said source of line voltage and said load, such that the application of a signal to said off-trigger circuits causes said switching devices to be switched to a conducting condition for enabling said capacitor means to be discharged through the load to back-bias the conducting silicon controlled rectifier to its non-conducting state.

3. The improvement of a solid state relay comprising the combination of first and second silicon controlled rectifiers connected in parallel between a source of line voltage and a load, said silicon controlled rectifiers being connected in opposite polarity for enabling either A.C. current or D.C. current to flow from the line voltage source to the load in response to the application of a turn-on trigger signal to the gates of said silicon controlled rectifiers, and control means for applying turn-on and turn-off trigger signals comprising a signal source, a pair of on-trigger circuits connected to said signal source, one of said on-trigger circuits including a rectifier connected to apply on-trigger signals of one polarity to the gate of said first silicon controlled rectifier for triggering it into conduction, the other on-trigger circuit including a rectifier connected to apply on-trigger signals of an opposite polarity to the gate of said second silicon controlled rectifier triggering it into conduction, and a pair of off-trigger circuits having their inputs connected to said signal source and their outputs connected to control said silicon controlled rectifiers, such that the application of a signal to said off-trigger circuits provides an output pulse which causes the conducting silicon controlled rectifier to be back-biased to its non-conducting state.

References Cited by the Examiner

UNITED STATES PATENTS 3,098,949 7/1963 Goldberg -------- 307—88.5 X

ARTHUR GAUSS, *Primary Examiner.*